United States Patent
Oh

[11] Patent Number: 5,600,229
[45] Date of Patent: Feb. 4, 1997

[54] SYSTEM FOR MONITORING ENERGY PERFORMANCE OF SECONDARY BATTERY, AND METHOD THEREFOR

[75] Inventor: Se-Chun Oh, Seungnam, Rep. of Korea

[73] Assignee: Samsung Heavy Industries Co., Ltd., Seoul, Rep. of Korea

[21] Appl. No.: 343,874

[22] Filed: Nov. 17, 1994

[30]   Foreign Application Priority Data

Mar. 31, 1994 [KR] Rep. of Korea ......................... 94-6828

[51] Int. Cl.$^6$ ................................................... H01N 10/48
[52] U.S. Cl. .............................................. 320/48; 324/426
[58] Field of Search ................................. 320/30, 39, 40, 320/48; 324/426, 229, 433; 340/635, 636

[56]   References Cited

U.S. PATENT DOCUMENTS

| | | | |
|---|---|---|---|
| 4,455,523 | 6/1984 | Koenck | 320/48 X |
| 4,707,795 | 11/1987 | Alber et al. | |
| 4,775,827 | 10/1988 | Ijntema et al. | 320/48 X |
| 5,159,272 | 10/1992 | Rao et al. | 340/636 X |
| 5,473,262 | 12/1995 | Yoshimatsu | 320/48 X |

Primary Examiner—Edward H. Tso
Attorney, Agent, or Firm—Antonelli, Terry, Stout & Kraus, LLP

[57]   ABSTRACT

A system for monitoring the energy performance of a secondary battery, and a method therefor, are disclosed. A micro-processor (32) is used to compute the energy capacity during the use of the battery by charging and discharging, thereby determining the decrease in the battery capacity. This data is provided to the user and is transmitted to a battery residue capacity measuring means, so that the battery may be charged if needed. The total discharged energy amount is stored in a ROM, and analog signals obtained from a power supply means are converted to digital signals, while an actually used total energy amount is stored in a non-volatile RAM (35). The value stored in the RAM (35) is compared with the value stored in the ROM 33, thereby computing the decrease of the battery capacity. This decrease in the battery capacity is transmitted through an output processing section (37) to a display means (40) for display so that the user and the battery residue capacity measuring means (60) know the decrease in battery capacity. Therefore, the monitoring of the energy performance of the battery can be determined even during the operation of the system. Based on the value of the decrease of the battery capacity, the replacement time of the battery can be determined, and therefore, system malfunctioning due to power failure can be prevented.

3 Claims, 2 Drawing Sheets

SYSTEM FOR MONITORING ENERGY PERFORMANCE OF SECONDARY BATTERY, AND METHOD THEREFOR

FIELD OF THE INVENTION

1. Background of the Invention

The present invention relates to a system for monitoring energy performance of a secondary battery, and particularly relates to a system and a method for monitoring a secondary battery energy performance, in which a micro-processor is used for computing the energy capacity related to the charge and discharge of the battery, thereby monitoring the battery energy performance.

2. Description of the Prior Art

The secondary battery which is used for electric cars an uninterruptable power supply (UPS) can be recharged to reuse it. However, in the case of the secondary battery, when the battery is subjected to repeated charges and discharges, the energy performance of the battery decreases in the long run. The energy capacity of the battery, i.e., the ampere-hour are decreased, with the result that the actual energy capacity becomes smaller than the rated energy capacity.

Thus if the charging and discharging of the battery are repeated, the energy performance of the battery decreases, and therefore, the user does not know the exact energy capacity of the battery.

In measuring such a decrease in the energy performance of the battery, conventionally the battery is subjected to a discharge after removing the load so as to measure the energy performance of the battery.

However, this is not real time monitoring, and there is difficulty in the user directly measuring the energy performance of the battery. See U.S. Pat. No. 4,707,795.

Another battery energy performance measuring method is such that, when the battery is charged, the charge and discharge are considered as one unconditional round. In this method, the number of the rounds of charging and discharging is taken as the criteria for the charging and discharging. Therefore, this criteria cannot be applied when complete charging and complete discharging continues.

However, in electric cars or in UPS, charging and discharging is repeated in a continuous manner. Therefore when the battery is charged before the battery is discharged to a certain discharge level, if a charge and a discharge are taken as one round, there occurs a large difference between the expected energy capacity decrease and the actual energy capacity decrease resultant from the use of the battery.

If this type of operation is continued, a system in which the battery is used as the power source cannot measure the exact capacity of the battery because of the lack of preciseness in the computation of the energy capacity due to the decrease in the life expectancy of the battery.

The maximum charge/discharge life of the secondary battery is indicated by the manufacturing company of currently used secondary batteries. However, this indicates battery life under the condition when charging is performed after discharging is completed to a certain level. However, in industries using secondary batteries, the charging and discharging is performed in a random manner. Therefore, the value which is indicated as the life of the battery loses meaning.

SUMMARY OF THE INVENTION

The present invention overcomes the above described disadvantages of the conventional technique.

Therefore it is an object of the present invention to provide a system for monitoring a secondary battery energy performance, in which a micro-processor is used to check the energy capacity of the battery over time and saves this data, thereby providing a value of the decrease of the energy capacity of the battery and monitoring the energy performance of the battery.

It is another object of the present invention to provide a method for monitoring the energy performance of a secondary battery, in which, when an energy level below a certain reference level (60% in the present invention) is indicated after repeating of charging and discharging to provide the user with an indication that the user should replace the battery thereby preventing system malfunction.

In achieving the above objects, the monitoring system according to the present invention includes: a power supply means for supplying a power source to the battery; a current measuring means for measuring a magnitude of the current generated from the power supply means; a monitoring means having a micro-processor for monitoring the energy performance of the battery by comparing the total unused energy amount of the battery with the total used energy amount obtained by measuring the magnitude of the current in the current measuring means; a display means for displaying the battery energy performance value of the monitoring means; an input means for inputting the information on the battery by the user; a residue capacity measuring means receiving the energy performance monitoring value from the monitoring means; and a charging means for charging the battery in accordance with the energy performance value displayed in the residue capacity measuring means.

According to another aspect of the present invention, the energy performance monitoring method of the present invention is based on the monitoring system including: a micro-processor for monitoring the performance of the battery by comparing and computing a total energy amount of a secondary battery; an A/D converter for converting analog signals to digital signals; a ROM and a non-volatile RAM for storing the data processed by the micro-processor; a serial/parallel external apparatus connecting circuit for serving as a transmitting line to an external apparatus; an input processing section for processing the data inputted by the user; and an output processing section for outputting the data processed by the micro-processor. The energy performance monitoring method according to the present invention includes the steps of: obtaining the total energy amount up to the point where the energy performance of the battery is 60 and saving this data in the ROM; converting the analog signals of the current of the power supply means to digital signals by means of the A/D converter, and computing the total energy amount of the battery up to the present, so as to save the data into the non-volatile RAM; computing the battery performance at the present by comparing the data of the ROM with the data of the RAM so as to display the data through the output processing section 37 to the display means 40; and transmitting the total present usable energy amount (obtained by multiplying the current performance of the battery by the initial energy amount of the battery) through the serial/parallel external apparatus connecting circuit to the residue capacity measuring means and the charging means.

BRIEF DESCRIPTION OF THE DRAWINGS

The above object and other advantages of the present invention will become more apparent from description in detail of the preferred embodiment of the present invention with reference to the attached drawings in which.

DESCRIPTION OF THE PREFERRED EMBODIMENT

Figure 1:
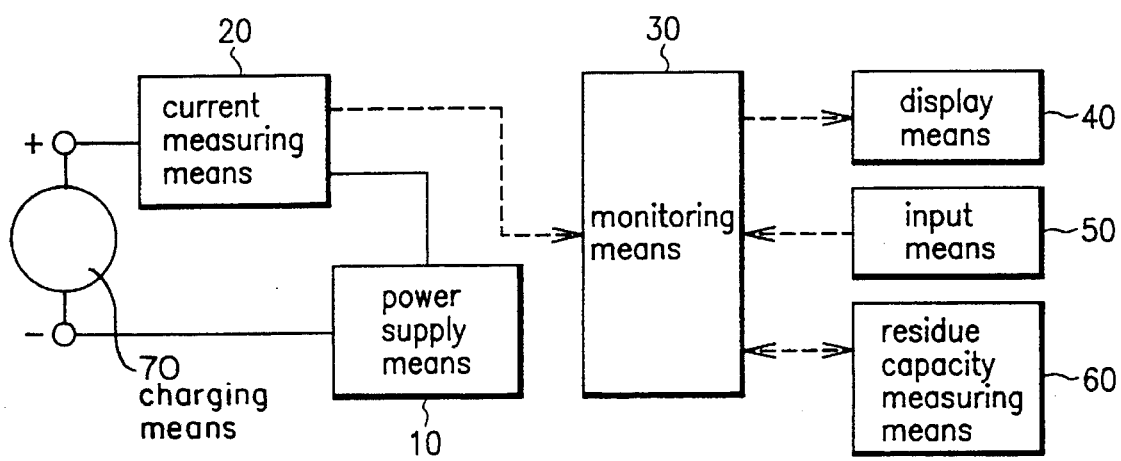
FIG. 1 is a block diagram of a preferred embodiment of the present invention.

FIG. 1 illustrates a block diagram of the preferred embodiment of the present invention.

Reference numeral 10 indicates a power supply means, and, in this power supply means 10, when the system operates as a power source battery or as a serial/parallel combination, the positive and negative terminals are connected to the load. When the battery is charged, the power is supplied through the positive and negative terminals, and, every time when a charging occurs, a current flow to the current measuring means 20 occurs.

Under this condition, when the system operates, the current flows from the power supply means 10 to the charging means 70, and the current is measured by the current measuring means 20.

Figure 3:
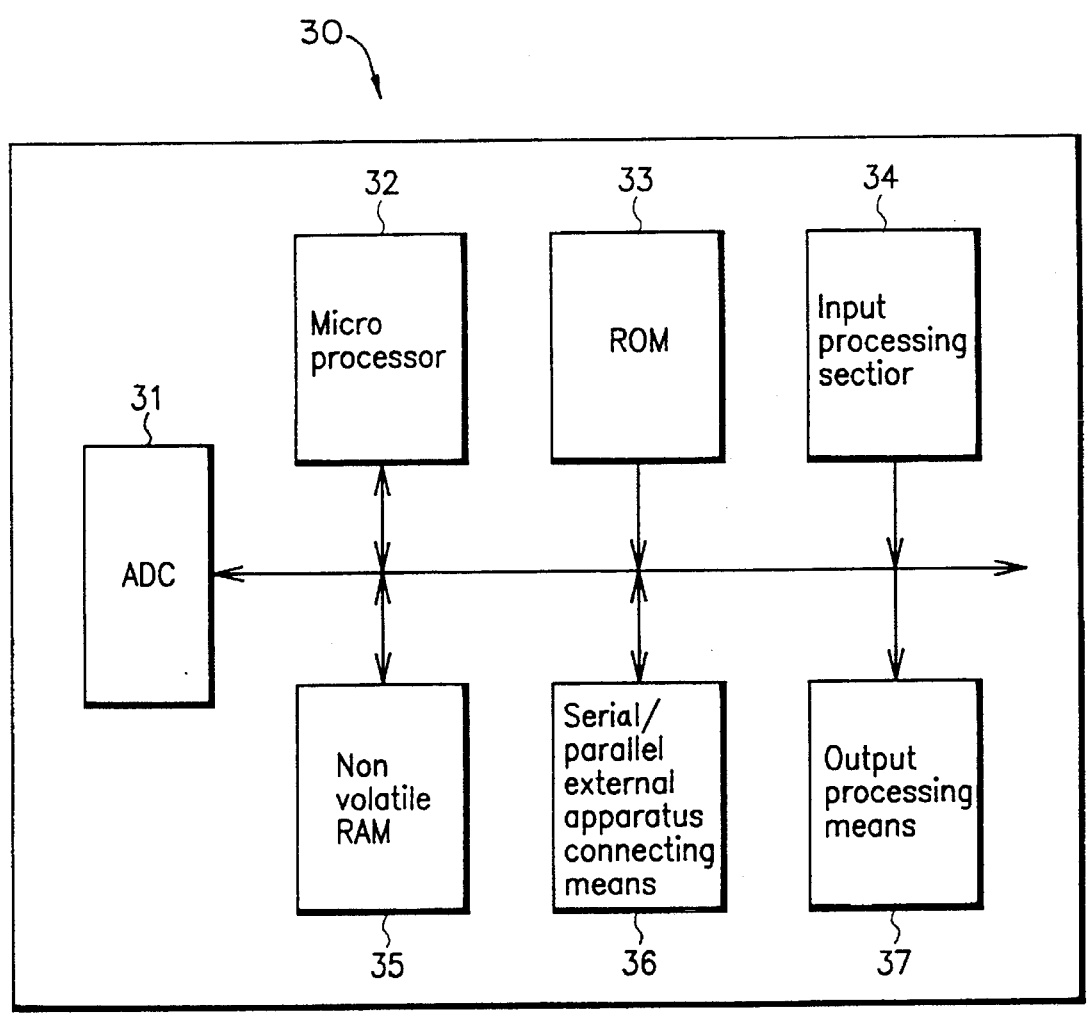
FIG. 3 is block diagram showing the construction of the monitoring system of FIG. 1.

The measured value of the current measuring means 20 is transmitted to a micro-processor 32, as illustrated in FIG. 3, so that the total amount of the energy used for charging and discharging can be checked over time. Thus the value of the decrease in the energy capacity of the battery is determined, and the relevant information is transmitted to the monitoring means 30 which sends the information to the user, the residue capacity measuring means 60 and the charging means 70. Then the information is converted to digital signals by an analog/digital converter 31 illustrated in FIG. 3 to be saved in a non-volatile RAM 35 also illustrated in FIG. 3.

The total energy amount of the battery which is stored in a ROM 33 illustrated in FIG. 3 is compared with the value which is stored in the RAM 35, so as to set a new value of the performance of the battery, thereby newly adjusting the energy capacity of the battery.

Figure 2:
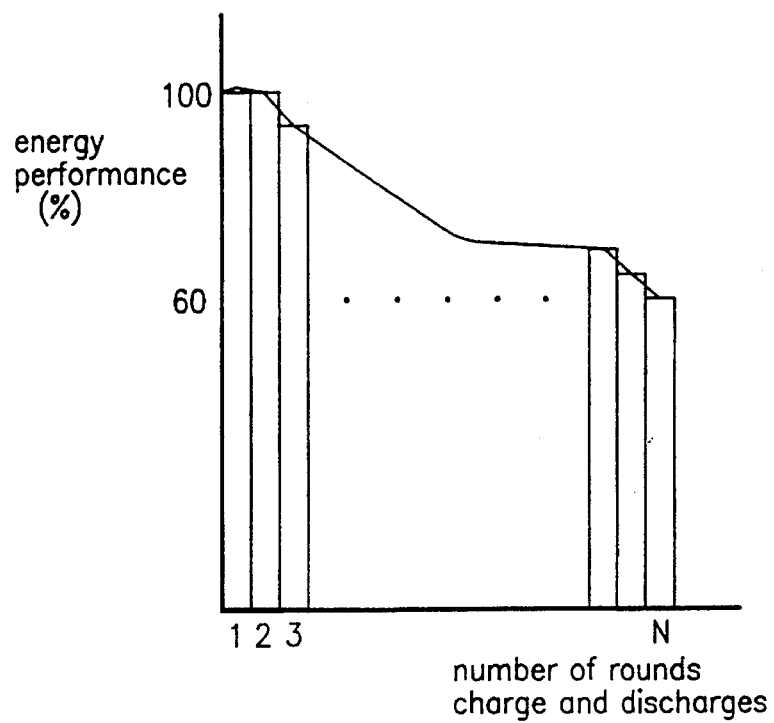
FIG. 2 is a graphical illustration showing the decrease of the energy performance of the secondary battery in accordance with the number of rounds of charging and discharging.

FIG. 2 graphically illustrates the decrease of the energy performance of the battery versus the number of rounds of charging and discharging.

As shown in this drawing, the energy performance decreases, as the number of rounds of charging and discharging increases.

The decrease of the energy performance appears in the same form regardless of the classification of the battery. There are differences in the slope of the curve, and the number of N rounds of charging and discharging by which the energy performance is decreased to 60% is varied in accordance with the classification of the batteries.

Accordingly, based on the graphical results of FIG. 2, the following equation can be obtained for the total energy use amount which is consumed until the energy performance drops to 60%.

Total energy amount of the battery (down to the 60% performance) =     (1)

$$\sum_{t=1}^{t=N} \text{(total energy at } N^{th} \text{ energy charge/discharge experiment)}$$

The total energy amount until when the energy performance reaches 60% is used as a reference data for the actual current energy performance, and this data is stored in the ROM 33.

FIG. 3 is a block diagram showing the construction of the monitoring means 30. The monitoring means 30 continuously checks the discharge amount of the current from the time when the battery is initially installed.

In other words, the micro-processor 32 digitizes the magnitude of the output current of the current measuring means 20 at certain time intervals, and this digital value is accumulated into a counter (not shown) of the non-volatile RAM 35.

The values which are accumulated into the counter of the non-volatile RAM 35 can be expressed by the following equation.

Total energy amount used up to the present =     (2)

$$\sum_{t=1}^{t=\text{present}} \text{(discharged energy amount checked at time } t)$$

While the computation based on the above formula is continued, the total energy amount of equation 1 is compared with the total energy amount used up to the present based on equation 2 by the micro-processor 32, thereby computing the current battery performance.

Current battery performance = equation 2/equation 1 =     (3)

$$\frac{\text{Total energy amount used up to the present}}{\text{Total energy amount up to 60\% performance}}$$

The result obtained by equation 3 represents a percentage of the performance decrease at present based on the initial total usable energy.

Therefore, based on equation 3, the total usable energy amount of the battery at certain intervals can be obtained, and this can be expressed by the following equation.

Energy amount with the present battery performance=initial battery energy amount x present battery performance (equation 4)

The values which are obtained from equations 3 and 4 are transmitted to an output processing section 37 so as to be displayed onto a display means 40.

Further these values are transmitted through a serial/parallel external display apparatus connecting circuit 36 to the charging means 70 so as to show the present optimum charging state. Further, these values are transmitted to other external system such as the residue battery capacity measuring means 60, thereby making it possible to recognize the current battery state.

Now the operation of the monitoring system of the present invention will be described in detail referring to FIG. 3.

Generally secondary batteries reduce in capacity as they are used.

Usually the manufacturing company indicates as to how many times the battery can be fully discharged and charged before the life expectancy of the battery is exhausted.

However, this value is an ideal value assuming full charges and full discharges which are not possible in industry, and therefore, this value had no significant meaning.

Therefore, in the present invention, the decrease in the energy capacity of the battery is computed under irregularly repeated charging and discharging conditions. For this purpose, the values of FIG. 2 were utilized.

That is, in FIG. 2, calculation is made of the capacity up to point where the total energy capacity becomes 60% (which can be set to another value if necessary). Then the calculated value represents the total amount of the energy which is inputted and outputted during the charging and discharging up to the point where the energy performance is decreased to 60%.

The total accumulated energy amount, which is computed by the micro-processor 32 and which corresponds to the area of FIG. 2 up to the point where the capacity decrease reaches 60%, is analyzed in advance, and this value is stored into the ROM 33.

Further, the micro-processor 32 stores the time varying energy capacity of the battery in the ROM 33.

Then if the user wishes to determine the capacity of one battery through an input means 50, then the micro-processor 32 reads the user's input through the input processing section 34, and computes the energy performance of the battery by referring to the value of the selected battery among the batteries having various characteristics.

The above procedure is carried out only one time when the battery is initially installed.

In the case when the battery initially installed by the user is not a new one, the present energy performance for the battery is computed based on the conventional non-real time energy performance measuring method as describe in U.S. Pat. No. 4,707,795. Then the computed value is transmitted through the input means 50 and the input processing section 34 of the monitoring means 30 to the micro-processor 32.

Then the system on which the battery is installed is operated by utilizing the information obtained in advance through the above described procedure. Then the monitoring of the energy performance of the battery, which is described below, is started.

That is, the monitoring of the energy performance of battery is carried out in the following manner. First, the user replaces a battery, and this fact is transmitted through the input means 50 and the input processing means 34, while the energy performance of the battery is continuously monitored and displayed in the display means.

As shown in FIG. 1, when the energy performance monitoring system of the present invention is activated, a current flows through the current measuring means 10 all the time.

In other words, when the battery is charged, the current flows from the charging means 70 to the power supply means 10, while, when a discharge is made, the current flows in the opposite direction.

During this time, the micro-processor 32 reads the current amount during the discharge (current flowing from the power supply means to the current measuring means) through the current measuring means 20.

The values of the current thus read are analog values, and therefore, they are converted into digital values through the A/D converter 31 and transmitted to the micro-processor 32.

Then the micro-processor 32 reads the digital current value to add it to a particular address of the non-volatile RAM 35 to save the value.

Under this condition, the content of the accumulating counter is divided by the accumulated value up to the point where the overall performance is decreased, i.e., divided by the total energy amount of the battery which is inputted in advance into the RAM 33. Thus a percentage of the present energy performance decrease of the battery is obtained.

This percentage is displayed through the output processing section 37 to the display means 34 in the form of a metered value, thereby making the user recognize the present energy performance of the battery.

Under this condition, if the charging means 70 or the residue capacity measuring means 60 request the battery energy performance data from the serial/parallel external apparatus connecting circuit 36, then the present usable energy amount which is obtained by multiplying the percentage of the battery energy performance by the initial energy capacity is transmitted through the serial/parallel external apparatus connecting circuit 36 to the residue capacity measuring means 60 and to the charging means 70.

As described above, the monitoring system 30 reads the current measuring means 20 to convert the output thereof to a digital value through the A/D converter 31. This value is accumulated in the non-volatile RAM 35, and then, is displayed to the user. A program which transmits the data to the charging means 70 and the residue capacity measuring means 60 upon required is stored in the ROM 33, and the function of the program is repeated as long as the system operates.

As described above, the decrease of the energy performance of the secondary battery, which is due to the aging life cycle of the battery caused by the use of the battery, can be known without being interrupted during the operation.

Further, according to the present invention, during the decrease of the energy performance of the battery due to the use of the battery, the total discharged energy amount is computed in advance, and the computed data is stored in the micro-processor. Further, the actually discharged energy amount is accumulated, and the accumulated energy amount is compared with the computed amount, thereby displaying the capacity decrease. Therefore, the user can make exact judgment as to when the battery is to be replaced, and therefore, the system malfunction due to the power failure can be prevented in advance. Further, the current (present) performance of the battery is made known by the charging means, and therefore, the reduction of the life expectancy of the battery due to an over-discharging can be prevented.

Further, according to the present invention, the ampere-hour method for measuring the residue capacity of the battery can be carried out without adding separate hardware with only a slight modification of the program.

What is claimed is:

1. A system for monitoring energy performance of a battery, comprising:

a power supply means for supplying a power source to the battery;

a current measuring means for measuring the magnitude of the current generated from said power supply means;

a monitoring means having a micro-processor for determining a value of the energy performance of the battery by comparing a total unused energy amount of the battery with a total used energy amount obtained by measuring a magnitude of current in said current measuring means;

a display means for displaying a value of the energy performance of the battery of said monitoring means;

an input means for inputting information related to the battery by a user;

a residue capacity measuring means for receiving the value of the energy performance of the battery from said monitoring means; and a charging means for charging the battery in accordance with the value of the energy performance of the battery received from said residue capacity measuring means.

2. A method for monitoring energy performance of a battery using a monitoring system including a micro-processor for monitoring the energy performance of the battery by comparing and computing a total energy amount of the battery, an A/D converter for converting analog signals to digital signals, a ROM and a non-volatile RAM for storing data processed by the micro-processor, a serial/parallel external apparatus connecting circuit functioning as a transmission line to an external apparatus, an input processing section for processing data inputted by a user, and an output processing section for outputting data processed by said micro-processor comprising the steps:

obtaining a total energy amount when the energy performance of the battery is at a set percentage and saving the total energy in said ROM;

converting analog signals representing current from a power supply means to digital data with said A/D converter, and computing a total energy amount of the battery up to a current time and saving the digital data in said non-volatile RAM;

computing a current battery performance at the current time by comparing data stored in said ROM with data stored in said RAM and transmitting the battery performance through said output processing section to the display means for display by the display means; and transmitting a total present usable energy amount obtained by multiplying the current battery performance by an initial energy amount and transmitting the total present usable energy amount through said serial/parallel external apparatus connecting circuit to a residue capacity measuring means and a charging means.

3. A method in accordance with claim 2 wherein:

the set percentage is 60%.

* * * * *